(12) United States Patent
Sato et al.

(10) Patent No.: US 6,418,065 B2
(45) Date of Patent: Jul. 9, 2002

(54) NONVOLATILE SEMICONDUCTOR MEMORY

(75) Inventors: Hiroshi Sato, Iruma; Satoshi Noda, Ome; Kiichi Manita, Kawagoe; Shoji Kubono, Ome; Koji Shigematsu, Fussa, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/883,236

(22) Filed: Jun. 19, 2001

(30) Foreign Application Priority Data

Jul. 12, 2000 (JP) ........................................ 2000-211716

(51) Int. Cl.⁷ ............................ G11C 7/00; H03K 7/162
(52) U.S. Cl. ............................. 365/189.11; 365/189.06; 365/186.09; 365/236; 327/589
(58) Field of Search ...................... 365/189.11, 189.06, 365/189.09, 236, 230.06, 185.18, 233; 327/390, 589

(56) References Cited

U.S. PATENT DOCUMENTS 6,229,740 B1 * 5/2001 Ogura .................... 365/189.11

* cited by examiner

*Primary Examiner*—David Lam
(74) *Attorney, Agent, or Firm*—Miles & Stockbridge P.C.

(57) ABSTRACT

Disclosed is a semiconductor memory having an internal booster, such as a flash memory, in which a situation that the program cannot escape from a writing operation can be avoided, and the writing operation can be promptly finished according to the level of an external source voltage. This semiconductor memory having an internal booster has a voltage detecting circuit (limiter LM) for detecting whether a boosted voltage has reached a predetermined potential or not and a timer capable of counting predetermined time. A control circuit applies the boosted voltage to a selected memory cell when the voltage detecting circuit detects that the boosted voltage has reached the predetermined potential and, when it is detected on the basis of counting information of the timer that the predetermined time has elapsed since the booster started the boosting operation, the control circuit applies the boosted voltage to the selected memory cell even if the boosted voltage generated by the booster has not reached the predetermined potential yet.

14 Claims, 10 Drawing Sheets

NONVOLATILE SEMICONDUCTOR MEMORY

BACKGROUND OF THE INVENTION

The present invention relates to a technique especially effective for application to a nonvolatile memory having an internal booster, from which stored information can be electrically erased. For example, the invention relates to a technique effective for use in a flash memory employed for a portable electronic device.

In a portable electronic device, a volatile memory such as a DRAM and a nonvolatile memory such as a flash memory are used as memory devices of data. On the other hand, in a portable electronic device, a battery is used as a power source, and there is always a danger of occurrence of a dead battery. Due to this, in the portable electronic devices, a nonvolatile memory of which data is not erased even if the battery runs down is becoming the mainstream.

A flash memory uses, as a memory cell, a nonvolatile memory element comprising a MOSFET of a double gate structure having a control gate and a floating gate. By changing a fixed charged amount of the floating gate, a threshold voltage of the MOSFET is changed, thereby enabling information to be stored. Such a flash memory needs a high voltage (such as ±10V or higher) for changing the threshold voltage by pulling/injecting charges from/to the floating gate of the nonvolatile memory element in an operation of writing/erasing data to/from a memory cell. In the flash memory, the high voltage is generally generated by an internal booster provided in a memory chip.

SUMMARY OF THE INVENTION

In an operation of writing/erasing data to/from a memory cell in a flash memory having an internal booster, the internal booster is activated to boost an internal source voltage simultaneously with the start of the writing/erasing operation. After the internal source voltage is boosted to a predetermined voltage, a write voltage or an erase voltage is actually applied to a memory cell. Methods of determining a timing of starting an actual writing/erasing operation after the internal source voltage is boosted to a predetermined voltage include a method of determining the timing by monitoring a generated voltage and a method of determining the timing after elapse of a predetermined time on assumption that the internal source voltage has increased to the predetermined potential. In the former method, when the internal source voltage does not reach the predetermined potential for some reason, there is a fear that the program cannot escape from the writing or erasing operation. Conventionally, the latter method of determining the timing on the basis of time is generally employed.

In the method of determining the timing of actually applying the write voltage or erase voltage to the memory cell on the basis of time, however, the time required to boost the internal source voltage depends on the magnitude of an external source voltage, capability of the booster, and the load capacity of word line, bit line, or the like. The capability of the booster and the load capacity can be calculated from a designed circuit, and the external power source is determined in the specification. The timing is determined by calculating an expected time in which the internal source voltage is sufficiently boosted also in the case of performing the writing/erasing operation on a worst capacitor in the circuit in a state where a source voltage of the lower limit value determined in the specification (generally, a voltage lower than a source voltage used by about 10%) is applied.

In recent years, however, the variety of the external power source of the memory is increasing. For example, external power sources operating at 3.3V, 2.5V, 1.8V and the like are in demand. In a system using a memory, which is constructed on a substrate of a stay-at-home apparatus such as a personal computer, the source voltage is fixed. Consequently, there is no problem to determine the timing by calculating a time in which the internal source voltage is expected to be boosted by a booster with the source voltage (Vcc−10%) of the lower limit value determined by the specification. On the other hand, the memory used in the portable electronic device may operate on a DC voltage such as 3.3V converted from AC 100V, on a built-in battery of, for example, 1.8V, or the like.

In this case, even if 1.8V is supplied, when the timing is determined by calculating the time in which the internal source voltage is expected to be sufficiently boosted also in the case of performing the writing/erasing operation on the worst capacity in the circuit, the data writing/erasing operation can be performed with accuracy without a problem. In the case where the internal booster is constructed by using an MOSFET, however, when the operation voltage is 1.8V, the drain current of the MOSFET is about ¼ of that when the voltage is 3.3V. Consequently, the time required to boost the internal source voltage increases by four times. For example, the data writing operation is finished in 1 mS (millisecond) when the source voltage is 3.3V. It takes, however, 4 mS when the source voltage is 1.8V. In an actual product, the writing/erasing timing is determined on the basis of 1.8V with which the writing operation takes longer time even in the case where the external source voltage is 3.3V in consideration of the possibility where the product is used with the external source voltage of 1.8V. Consequently, a problem such that the time required for the writing/erasing operation when the external source voltage is 3.3V is long more than necessary occurs.

Further, the inventors of the present invention have found that the time required to boost the internal source voltage varies also according to a pattern of write data. Specifically, in association with an increase in packing density of a semiconductor memory, a bit line pitch of the memory array in a semiconductor memory is becoming very high. A parasitic capacitance between neighboring bit lines is becoming larger than a capacitance parasitic on a bit line, which exists between the bit line and the substrate, and a capacitance between the bit line and a line extending above the bit line.

Moreover, since the flash memory generally adopts a method of precharging a bit line in accordance with write data and simultaneously writing all of memory cells connected to one word line (hereinbelow, referred to as one sector), there is a case that 210 bit lines are precharged. In such a case, when all the write data of one sector is "0" or only one bit is "0" (since when all the write data is "1", the writing operation is not performed), precharging against the parasitic capacitance between neighboring bit lines is not performed. When write data is 1010101 . . . 10, every other bit line is precharged, that is, the charging against all the parasitic capacitance between bit lines is performed. Consequently, the capacitive load on the booster is the heaviest in this case. By the deep examination on a flash memory being developed by the inventors of the present invention, it was found that a variation of about 1 mS at the maximum occurs in the boost time of the internal power source in accordance with the kind of write data.

In the conventional method of determining the write start timing on the basis of time, since the timing has to be determined by using the case of writing the data of "1010101 . . . 10" as the worst case regarding the data, the write start timing has to be further delayed. It was clarified that, when the timing is determined in consideration of the worst case with the source voltage of 1.8V, a time allowance of about five times as long as the time necessary to boost the power source voltage to write data of all "0" with the source voltage of 3.3V is necessary, so that the write time takes very long.

The inventors then examined the method of monitoring not time but a boosted internal source voltage and, when the internal source voltage reaches a predetermined potential, starting the writing operation. In this case, however, when the internal source voltage does not reach the predetermined potential by the cause such as a leak due to adhesion of a conductive foreign matter on a bit line, it is feared that the program cannot escape from the writing operation. It was also made clear that the method has a drawback that, by providing an internal source voltage monitoring circuit constructed by a resistance dividing circuit and a comparator, an extra resistive load is placed on the booster, and the time required to boost the internal source voltage increases.

An object of the invention is to provide a semiconductor memory having an internal booster such as a flash memory, capable of avoiding a situation that the program cannot escape from the writing operation and promptly finishing the writing operation in accordance with the level of an external source voltage.

The above and other objects and novel features of the present invention will become apparent from the description of the specification and the appended drawings.

The outline of a representative one of inventions disclosed in the specification will be briefly described as follows.

There is provided a semiconductor memory having an internal booster, comprising a voltage detecting circuit such as a limiter for detecting whether a boosted voltage has reached a predetermined potential or not and a timer capable of counting predetermined time. A control circuit applies the boosted voltage to a selected memory cell when the voltage detecting circuit detects that the boosted voltage has reached the predetermined potential and, when it is detected on the basis of counting information of the timer that the predetermined time has elapsed since the booster started the boosting operation, the control circuit applies the boosted voltage to the selected memory cell even if the boosted voltage generated by the booster has not reached the predetermined potential yet.

More specifically, there is provided a semiconductor memory having a plurality of memory cells and a booster for generating a boosted voltage on the basis of a source voltage supplied from the outside, for applying the boosted voltage to a selected memory cell when the voltage generated by the booster reaches a predetermined level, comprising: a voltage detecting circuit for detecting whether the boosted voltage has reached a predetermined potential or not; a control circuit capable of controlling start and stop of a boosting operation of the booster; and a timer capable of counting predetermined time. The control circuit applies the boosted voltage to a selected memory cell when the voltage detecting circuit detects that the boosted voltage has reached the predetermined potential and, when it is detected on the basis of counting information of the timer that the predetermined time has elapsed since the booster started the boosting operation, the control circuit applies the boosted voltage to the selected memory cell even if the boosted voltage generated by the booster has not reached the predetermined potential yet.

According to the means, also in the case where the level of an external source voltage is low and a voltage is not so boosted by the booster, after elapse of predetermined time, data is written to a memory cell. Consequently, the situation that the program cannot be escaped from the writing operation since the boosted voltage does not reach a predetermined potential conventionally occurred can be avoided. When the level of the external source voltage is high and the boosted voltage reaches a predetermined potential in short time, the writing operation is started. Consequently, the writing operation can be promptly finished.

Desirably, switching means for supplying or interrupting the boosted voltage is provided. The switching means receives a control signal from the control circuit and applies the boosted voltage to the selected memory cell. With the configuration, when a plurality of boosted voltages of levels different from each other such as the write voltage and a verify voltage are necessary, without changing the level itself of the voltage generated by the booster, the voltage to be applied to a memory cell can be changed only by operating the switch.

Preferably, a clock generating circuit for generating an internal clock signal is provided. By using the circuit, it becomes unnecessary to generate and supply a clock necessary for the operation of the booster on the outside of the chip of the semiconductor memory, so that the burden on designing of the user is lessened.

The booster operates on the basis of a clock signal for boosting generated by the clock generating circuit, and the timer operates on the basis of a clock signal for counting generated by the clock generating circuit. With the configuration, the clock generating circuit can be commonly used to generate the clock signal for boosting and the clock signal for counting.

The semiconductor memory further has a plurality of word lines. Each of the plurality of memory cells is connected to a corresponding word line, and the boosted voltage is applied to a word line to which the selected memory cell is coupled.

Further, the booster has a positive voltage generating circuit for generating a positive high voltage on the basis of a source voltage from the outside and a negative voltage generating circuit for generating a negative high voltage on the basis of the source voltage from the outside. With the configuration, not only the high voltage necessary for writing but also the high voltage necessary for erasing can be also generated on the inside of the chip.

Each of the plurality of memory cells has a threshold voltage corresponding to data to be stored. Consequently, multi-value information can be stored in a single memory cell.

Data is written/erased to/from each of the plurality of memory cells by using a tunnel phenomenon. In the writing/erasing method using the tunnel phenomenon, as compared with a method of injecting hot electrons into a memory cell by passing a drain current, a higher voltage is generally needed, and a burden is caused by the booster. Consequently, by applying the present invention, the effect is enhanced.

Further, according to another aspect of the invention, there is provided a semiconductor memory having a plurality of memory cells each having a threshold voltage corresponding to data to be stored, a plurality of bit lines, a plurality of data latches provided for the bit lines, and a booster for generating a boosted voltage on the basis of a source voltage supplied from the outside, each of the plurality of memory cells being coupled to a corresponding bit line, the boosted voltage being applied to the memory cell selected when the boosted voltage reaches a predetermined potential, and data being rewritten to the memory cell in accordance with data latched by the data latch, comprising: a voltage detecting circuit for detecting whether the boosted voltage has reached a predetermined potential or not; a control circuit capable of controlling start and stop of a boosting operation of the booster; and a timer capable of counting predetermined time, wherein the control circuit applies the boosted voltage to a selected memory cell when the voltage detecting circuit detects that the boosted voltage has reached the predetermined potential and, when it is detected on the basis of counting information of the timer that the predetermined time has elapsed since the booster started the boosting operation, the control circuit applies the boosted voltage to the selected memory cell even if the boosted voltage generated by the booster has not reached the predetermined potential yet.

According to the means, since the data latch is provided for each bit line, the writing operation can be performed in a plurality of times. As described above, even when the writing operation is started after elapse of the predetermined time before the boosted voltage reaches the predetermined potential, by increasing the number of writing times, accurate writing can be guaranteed. Thus, the situation that the program cannot be escaped from the writing operation since the boosted voltage does not reach the predetermined potential can be avoided. In the case where the level of the external source voltage is high, when the boosted voltage reaches a predetermined potential, the writing operation is started. Consequently, the writing operation can be promptly finished.

Desirably, each of the memory cells is constructed to store multi-value information by having any one of a plurality of threshold voltages. With the configuration, without enlarging the area of the memory array, the storage capacity can be increased. In this case, a higher boosted voltage is necessary as compared with the case of binary data. By applying the invention, it can be prevented that the program cannot be escaped from the writing operation when the external source voltage is low.

A second voltage boosted by the booster in accordance with data latched by the data latch is applied to the bit line, and the control circuit reserves activation of the timer until the second voltage reaches the predetermined potential. When the writing operation is started before the potential of the bit line becomes sufficiently high, there is the possibility that a "disturb" failure that the threshold voltage of a not-selected memory cell changes occurs. Since the timer is started after the boosted voltage to be applied to the bit line has reached the potential, even when the writing operation is started after elapse of the predetermined time after that, the level of the boosted voltage to be applied to the bit line is guaranteed, so that the occurrence of the disturb failure can be prevented.

DESCRIPTION OF THE PREFERRED EMBODIMENTS

Embodiments of the invention will be described hereinbelow with reference to the drawings.

Figure 1:
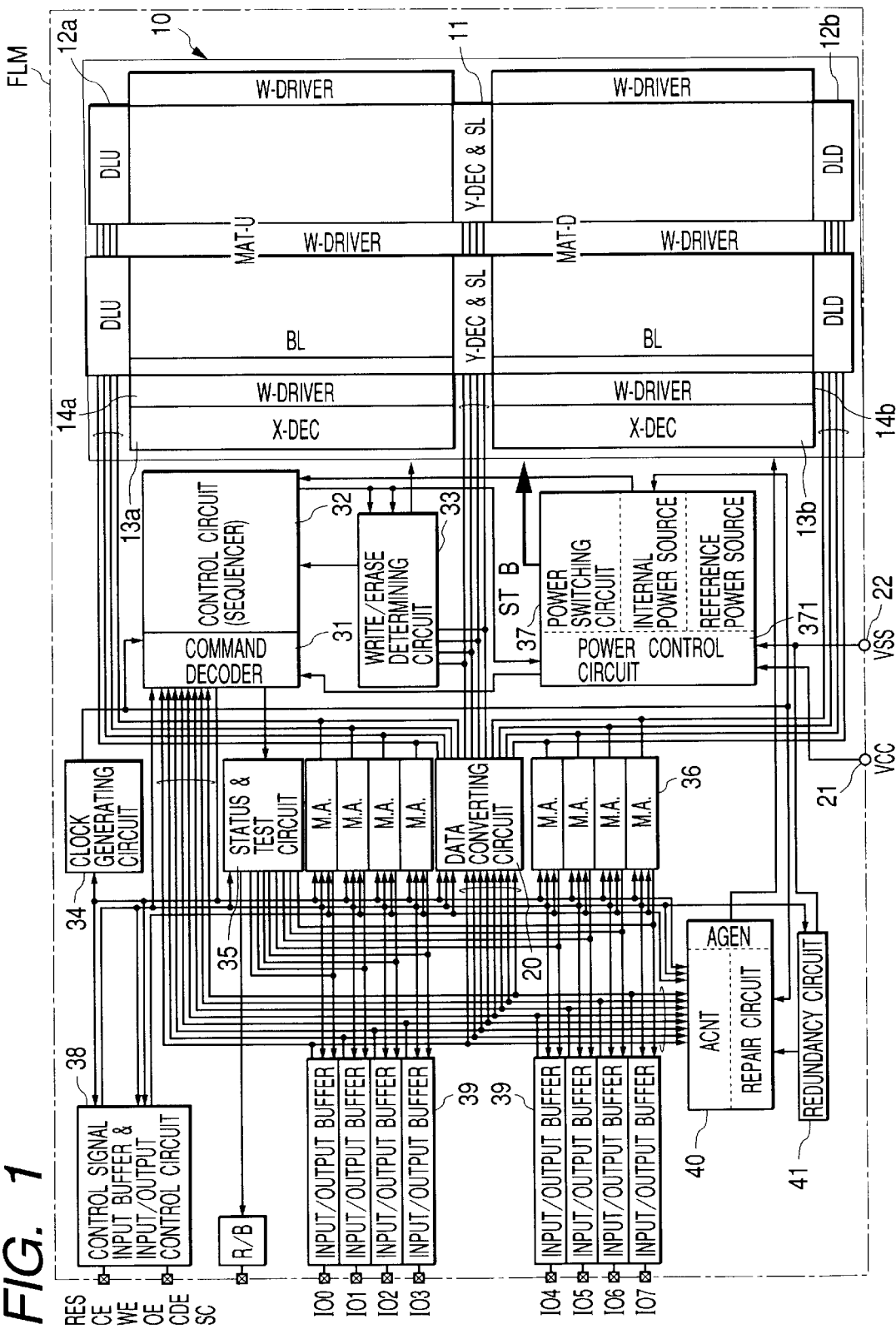
FIG. 1 is a block diagram showing an example of a flash memory as one of semiconductor memories to which the invention is effectively applied.

FIG. 1 is a block diagram showing an example of a flash memory as an example of a semiconductor memory having therein a booster, to which the invention is effectively applied. Although not limited, a flash memory FLM of the example takes the form of a multi-value memory capable of storing two-bit data to one memory cell, and is formed on a single semiconductor chip made of single crystal silicon or the like.

In the embodiment, a memory array is constructed by two mats. Between the two mats, a sense amplifier and latch circuit (hereinbelow, called a sense and latch circuit and indicated as SL in the drawing) which is connected to bit lines BL in each of the mats, and amplifies and latches a read signal is disposed. On the outer sides of the mats, that is, the sides opposite to the sense and latch circuit SL over the bit lines BL, latches for temporarily storing read data are disposed. The latches will be called data latches hereinbelow, and indicated as DL in the drawing. The data latch on the upper mat side will be referred to as DLU and the data latch on the lower mat side will be referred to as DLD.

In FIG. 1, reference numeral 10 denotes a memory array constructed by two memory mats MAT-U and MAT-D, and 20 indicates a data converting circuit for converting write data input from the outside in the case of storing four-value data into four-value data (three bits) every two bits. In each of the memory mats MAT-U and MAT-D, memory cells each constructed by a MOSFET of a double gate structure having a floating gate and a control gate are arranged in a matrix, control gates of the memory cells in the same row are continuously formed to construct a word line WL, and drains of the memory cells in the same column can be connected to a common bit line BL.

The memory array 10 has, in correspondence with the memory mats MAT-U and MAT-D, X address decoders (word decoders) 13a and 13b and word drivers 14a and 14b each for driving one of word lines WL in each memory mat to a selection level in accordance with corresponding one of decode results of the decoders 13a and 13b. Although not limited, in the memory array 10 of the embodiment, the word drivers are provided on both sides and in the center of each of the memory mats. A Y address decoder (Y-DEC) and column switches (CSW) which are selectively turned on/off by the decoder (Y-DEC) and transfer data from the data converting circuit 20 to the sense and latch circuit are constructed integrally with the sense latch column (SL) and the data latch column (DL).

In FIG. 1, the Y address decoder, column switch, and sense and latch circuit are shown by a single function block 11 (Y-DEC & SL). Data latch columns 12a and 12b for latching write data obtained by conversion of the data converting circuit 20 and read data from a memory cell are disposed on the outside (upper and lower sides in the drawing) of the memory mats. In the case of storing four-value data, three-bit write data obtained by the conversion of the data converting circuit 20 is latched so as to be divided to the data latch columns 12a and 12b and the sense and latch 11. In a reading operation, the data read from the memory cell is latched by the data latch columns 12a and 12b and the sense and latch 11 and is properly subjected to logic computation, thereby being inversely converted to 2-bit data.

The flash memory of the embodiment has, although not limited, a command decoder 31 for decoding a command supplied from an external controller, and a control circuit (sequencer) 32 for sequentially generating and outputting control signals to circuits in the memory to execute a process corresponding to the command on the basis of the decode result of the command decoder 31. When a command is given, the command decoder 31 decodes the command and automatically performs a corresponding process. The control circuit 32 has a ROM (Read Only Memory) in which, for example, a series of micro commands necessary to execute a command is stored. The command decoder 31 generates a head address of the micro command group corresponding to the command and supplies the head address to the control circuit 32 where the micro commands are sequentially executed to thereby generate control signals for circuits in the chip.

Other than the above circuits, the multi-value flash memory of the embodiment further has: a write/erase determining circuit 33 for determining whether a writing or erasing operation is finished or not on the basis of data of the sense and latch column SL, notifying the control circuit 32 of the result of determination, and finishing the writing or erasing operation; a clock generating circuit 34 having an oscillator and a frequency divider, for generating a plurality of timing clocks necessary for operations of internal circuits, such as operation clocks CK1, CK2, CLK1, CLK2, and PCLK2 for a booster which will be described hereinlater and a clock φc for a timer and supplying the clocks to the circuits in the memory; a status and test circuit 35 having the functions of generating and outputting a ready/busy signal R/B in which the status of the memory is reflected and which indicates whether the memory can be accessed from the outside or not and testing an internal circuit; a main amplifier circuit 36 for amplifying a signal read from the memory array 10; a power circuit 37; an input/output control circuit 38 for capturing an address signal, a write data signal, and a command input from the outside, supplying the captured signal to a predetermined circuit on the inside, and outputting a read data signal to the outside; an input/output buffer 39 for receiving a control signal input from the outside and supplying the signal to the control circuit 32 an other predetermined internal circuit; an address control circuit 40; and a redundancy circuit 41 for replacing a defective bit in the memory array with a spare memory row.

The power circuit 37 includes a reference power voltage generating circuit for generating a voltage as a reference of a write voltage or the like, an internal source voltage generating circuit for generating a voltage required on the inside of the chip such as a write voltage, erase voltage, read voltage, or verify voltage on the basis of a source voltage Vcc supplied from the outside, a power switching circuit for selecting a desired one of the voltages in accordance with the memory operating state and supplying the selected voltage to the memory array 10, and a power control circuit 371 for controlling those circuits. Boosters 1 and 2 of the embodiment are provided in the internal source voltage generating circuit in the power circuit 37. In FIG. 1, reference numeral 21 denotes a source voltage terminal to which the source voltage Vcc is applied from the outside, and 22 similarly indicates a source voltage terminal (ground terminal) to which the ground potential Vss is applied.

The address control circuit 40 includes an address counter ACNT for receiving an address signal input from the outside and incrementing its count value, an address generator AGEN for automatically updating a Y address at the time of data transfer and automatically generating an X address at the time of data erasure, and a repair circuit for comparing an input address with a defective address and, when the addresses match with each other, switching a memory row or column to be selected.

Examples of control signals supplied from an external CPU or the like to the flash memory of the embodiment are a reset signal RES, a chip select signal CE, a write control signal WE, an output control signal OE, a command enable signal CDE indicative of a command, data input, address input, or the like, and a system clock SC. The command and address are supplied to the inside of the chip via the input/output buffer 39 in accordance with the command enable signal CDE and the write control signal WE. Write data is supplied to the inside of the chip synchronously with the system clock SC received in a state where the command enable signal CDE indicates the command or data input.

Figure 2:
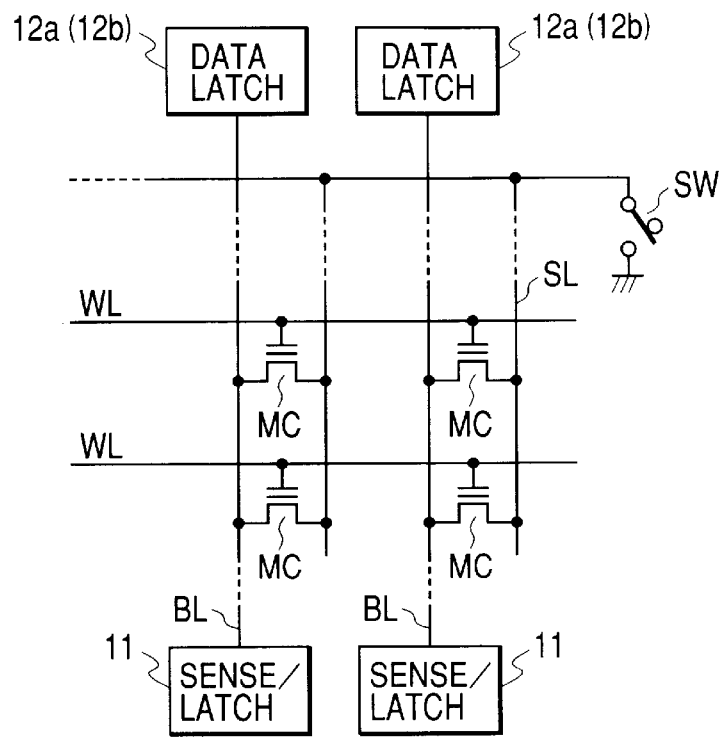
FIG. 2 is a circuit diagram schematically showing the configuration of a memory array.

FIG. 2 shows a schematic configuration of the memory array 10. A plurality of memory cells MC are arranged in a matrix in the memory array 10. The word line WL to which control gates of the memory cells in the same row are connected and the bit line BL to which drains of the memory cells in the same column are connected are disposed so as to cross each other. The sources of the memory cells are connected to the common source line SL for applying the ground potential. The source line SL is provided with a switch SW so that the sources of the memory cells can be opened in a writing operation.

The sense and latch circuit 11 having the function of a sense amplifier for amplifying the potential of each of bit lines and a data latching function is connected to one end of the bit line BL. A data latch 12a (12b) having the data latching function is connected to the other end of each bit line BL. The data latch 12a (12b) is used to latch data for changing the threshold voltage of a selected memory cell step by step when the memory operates as a multi-value memory. Each of the sense and latch circuit 11 and the data latch 12a (12b) has a switching device for electrical connection/disconnection to/from a corresponding bit line and means for discharging the bit line. The sense and latch circuit 11 may be provided with an inverting circuit for inverting the logic of data on the bit line. Since such switching device and inverting circuit are provided, in the case of four-value data storage, data read from the memory cells while changing a read level are subjected to a wired arithmetic on the bit line, thereby enabling the data to be converted to two-bit data in the memory array.

Figure 3A:
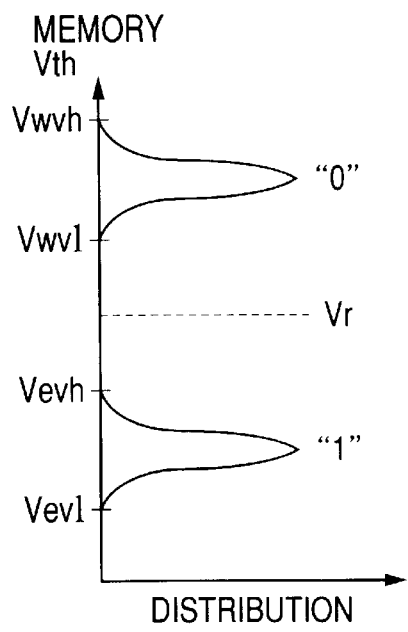
FIGS. 3A and 3B are explanatory diagrams showing a distribution of a threshold voltage in the case of storing binary data to a memory cell and that in the case of storing four-value data.
Figure 3B:
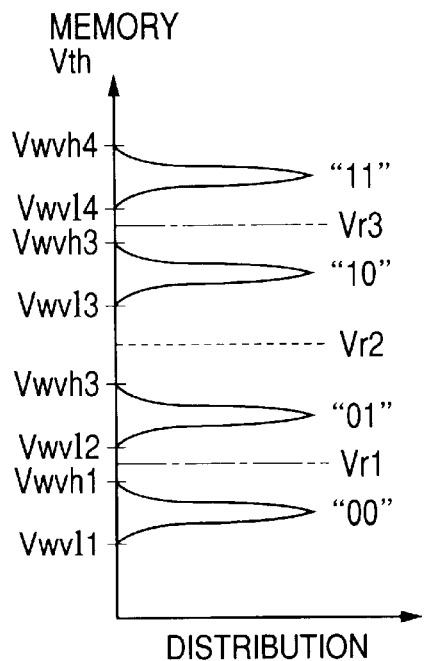

Although not limited, the flash memory of the embodiment is constructed so that binary data or four-value data can be stored in each memory cell. FIG. 3A shows a distribution of threshold voltages in the case of storing binary data to each of memory cells and FIG. 3B shows a distribution of threshold voltages in the case of storing four-value data. In the case of storing binary data, verify voltages Vwvh and Vwvl are set so that the threshold voltage of a memory cell corresponding to storage data "1" lies in a range of, for example, ±0.7V of 4.3V. Verify voltages Vevh and Vevl are set so that the threshold voltage of a memory cell corresponding to storage data "0" lies in a range of, for example, ±0.7V of 1.5V. A read voltage Vr is set at an intermediate level of 2.9V or the like.

In the case of storing four-value data, write verify voltages Vwvh4 and Vwvl4 are set so that the threshold voltage of a memory cell corresponding to storage data "11" lies in a range of, for example, ±0.4V of 4.8V. Write verify voltages Vwvh3, Vwvl3, Vwvh2, Vwvl3, Vwvh1, and Vwvl1 are set so that the threshold voltage of the memory cell corresponding to storage data "10" lies in a range of, for example, ±0.4V of 3.6V, the threshold voltage of the memory cell corresponding to storage data "01" lies in a range of, for example, ±0.4V of 2.2V, and the threshold voltage of the memory cell corresponding to storage data "00" lies in a range of, for example, ±0.4V of 1.0V. Four-value read voltages Vr1, Vr2, and Vr3 are set to levels such as 1.5V, 2.9V, and 3.8V, respectively.

Figure 4:
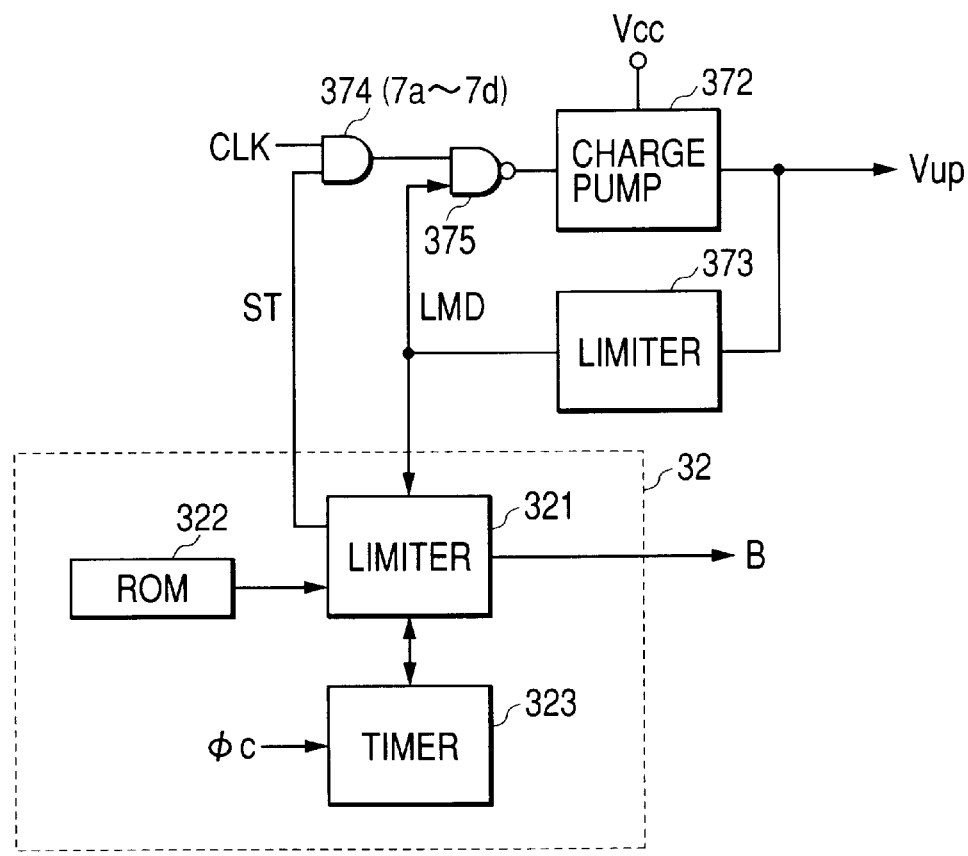
FIG. 4 is a block diagram showing the primary constituents of a semiconductor memory according to the invention.

The gist of the invention will now be described by referring to FIG. 4. Shown in FIG. 4 are a central processing unit 321 (hereinbelow, called a CPU) of the control circuit 32, a ROM (Read Only Memory) 322 in which a control program and the like of the CPU 321 are stored, a charge pump 372 as a component of an internal source voltage generating circuit provided in the power circuit 37, and a limiter 373 provided on the output side of the charge pump 372, for limiting a boosted voltage to a desired level. The limiter 373 has the function of outputting a high-level detection signal LMD when an output voltage Vup of the booster reaches the desired level.

Figure 5:
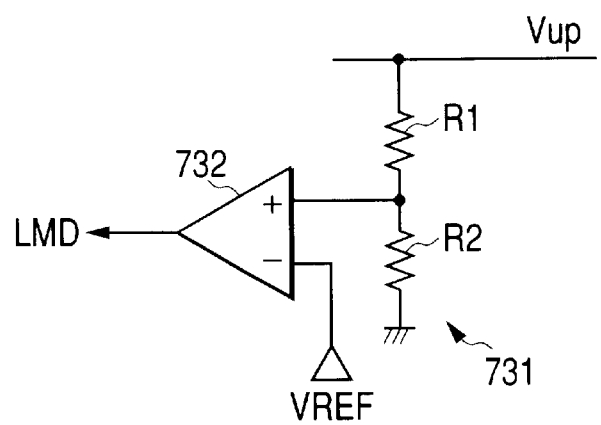
FIG. 5 is a circuit diagram showing the basic configuration of a limiter provided for a charge pump.

Since various limiters are already known, the limiter will not be described in detail but its schematic configuration shown in FIG. 5 will be briefly described. The limiter has a resistance dividing circuit 731 constructed by two resistors R1 and R2 connected in series between the output terminal of the booster and the ground point, for generating a voltage obtained by dividing the boosted voltage Vup at a resistance ratio of the resistors R1 and R2, and a comparator 732 for comparing the voltage generated by the resistance dividing circuit 731 with a preset reference voltage Vref of a predetermined level.

In the example of FIG. 4, an AND gate 375 for receiving, as input signals, an output of an AND gate 374 for controlling the clock CLK to the charge pump 372 in response to a start signal ST from the CPU 321 and the output signal LMD of the limiter 373 is provided, and the supply of the clock signal CLK to the charge pump 372 is controlled by the limiter output LMD. When the boosted voltage output from the charge pump 372 becomes higher than the desired level, the operation of the charge pump 372 is stopped, so that excess power consumption can be reduced.

In the flash memory of the embodiment, the limiter output LMD is supplied to the CPU 321 in the control circuit 32 and, in response to a change to the high level of the limiter output LMD, the CPU 321 outputs a signal B to make the word driver 14a start applying a write voltage to the word line WL.

Further, in the embodiment, the control circuit 32 is provided with a timer 323. The CPU 321 sets set time read from the ROM 322 into the timer 323 and starts the timer 323 simultaneously with a write start process. After elapse of a predetermined time, even if the detection signal LMD from the limiter 373 is not received, application of the write or erase voltage to the memory cell is started. The timer 323 has a binary counter and performs a counting operation of counting a clock φc having a cycle of, for example, 50 nS (nanoseconds) supplied from the clock generating circuit (in the block 34 in FIG. 1) provided on the inside of the chip. In place of the timer having the binary counter for counting the clock φc, a software timer for performing counting (incrementing the value of a register) by the operation of a program by the CPU may be used.

Figure 6:
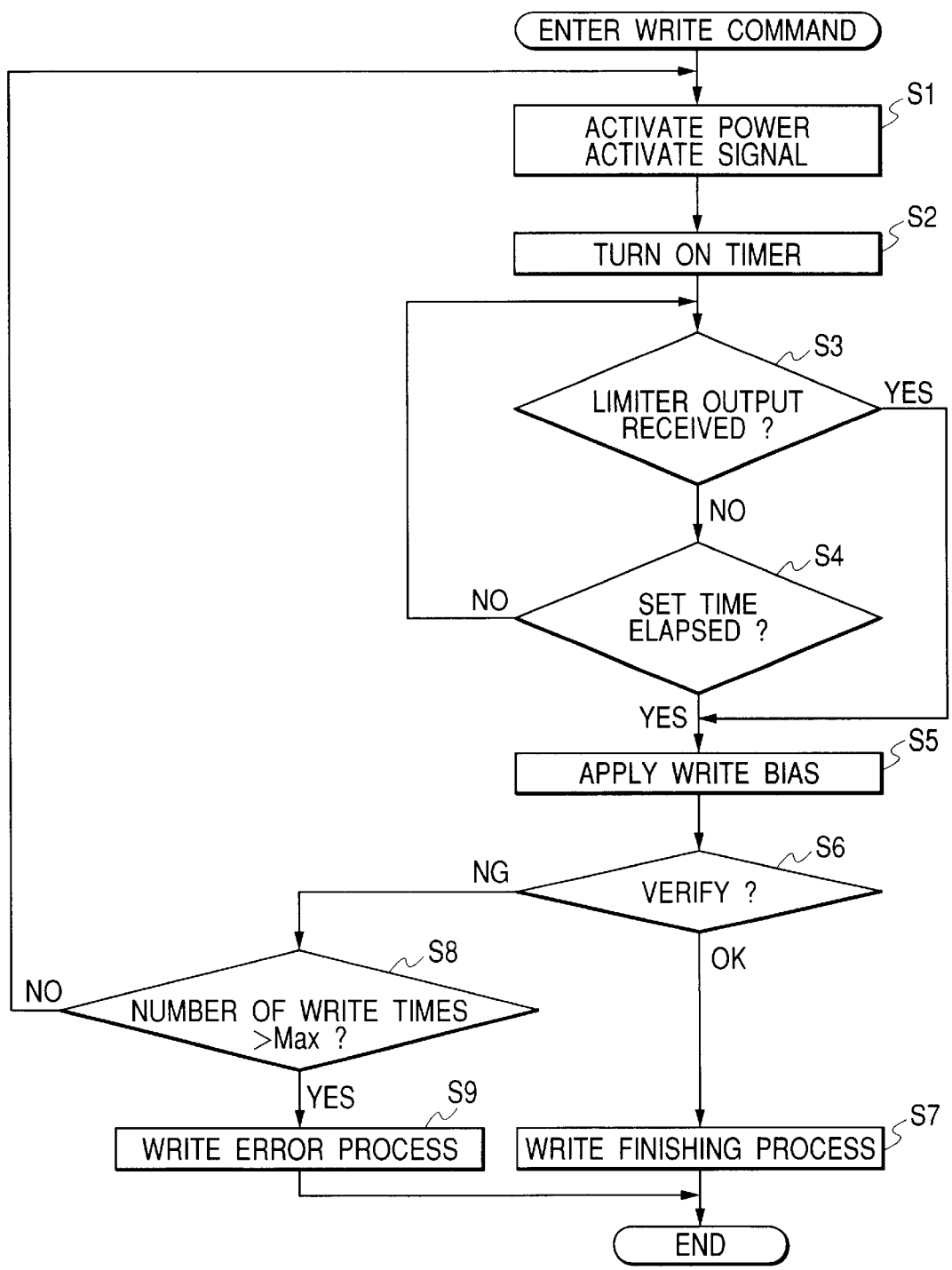
FIG. 6 is a flowchart showing an example of a write control procedure in the flash memory to which the invention is applied.

FIG. 6 shows an example of a write control procedure of the control circuit 32 in the flash memory to which the invention is applied. In the embodiment, although not limited, the writing operation is performed by increasing the threshold voltage of a memory cell by applying a high voltage to the word line WL (control gate) to inject negative charges to the floating gate of the memory cell.

When a write command is received, the control circuit 32 asserts the start signal ST to the charge pump 372 in the internal source voltage generating circuit to start boosting (step S1). Subsequently, the control circuit 32 starts the timer 323 (step S2). Specifically, set time of the timer is read from the ROM 322 and set in the timer 323. After that, whether the detection signal LMD from the limiter 373 is received or not is checked in step S3. If NO, the program advances to step S4 where whether the set time of the timer 323 has elapsed or not is determined. When the set time has not elapsed yet, the program returns to step S3 and the determining operation is repeated.

When it is determined in step S3 that the detection signal LMD is received, or even if the detection signal LMD is not received, when it is determined in step S4 that the set time has elapsed, the program advances to step S5 where the control signal B to start applying the write voltage is input to the word driver 14a. In the following step S6, a verifying operation of verifying whether the threshold voltage of the memory cell has changed to the predetermined level or not is executed. When the threshold voltage has changed to the verify voltage, a writing operation finishing process for setting "1" in a write end bit in a status register in the status and test circuit 35 is performed (step S7). By the process, the ready/busy signal R/B is changed to the level indicative of a ready status, so that the end of the writing operation can be notified to external devices.

On the other hand, when the threshold voltage has not changed to the verify voltage, the program moves to step S8 where whether the number of writing times has reached a preset number of times or not is determined. If NO, the program returns to step S1 and the process is re-started from the start of the internal power source. When the program advances to step S8 again and whether or not the number of writing times has reached the preset number of times is determined, if it is determined that the number of writing times had reached the preset number of times before the writing operation is finished, the program moves to step S9 where a write error process of setting "1" in a write error bit in the status register is performed.

Figure 7:
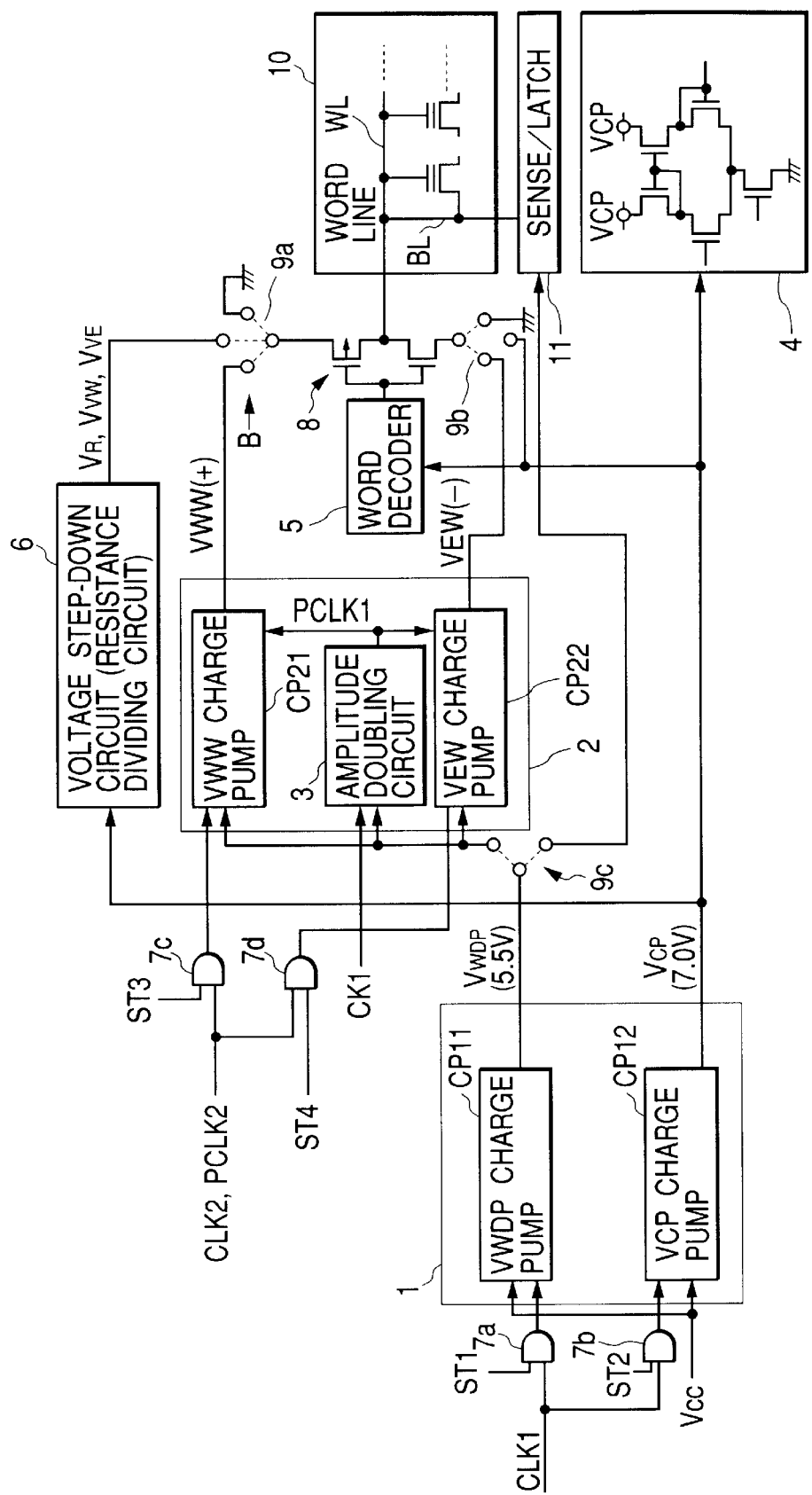
FIG. 7 is a block diagram showing the schematic configuration of an internal power source circuit portion in the flash memory to which the invention is applied.

FIG. 7 shows a schematic configuration of the internal power source circuit of the flash memory having the booster according to the invention. In FIG. 7, reference numeral 1 denotes a first booster for performing a boost of a first stage on the basis of the source voltage Vcc of 1.8V to 3.3V from the outside, and 2 indicates a second booster for performing a boost of a second stage on the basis of a voltage VWDP boosted by the first booster 1. In the embodiment, the first booster 1 has two charge pumps CP11 and CP12 each of a capacitor parallel type. The second booster 2 has two charge pumps CP21 and CP22 each of a capacitor serial type.

Although not limited, the charge pumps CP11 and CP12 of the capacity parallel type in the first booster 1 generate the boosted voltage VWDP such as 7V and a boosted voltage VCP such as 5.5V, respectively, on the basis of the source voltage Vcc. Although the limiter 373 and the control gate 373 are not shown in FIG. 7, each of the charge pumps CP11, CP12, CP21, and CP22 is provided with the limiter and the control gate corresponding to each boosted voltage.

In the capacitor serial type charge pumps CP21 and CP22 in the second booster 2, the charge pump CP21 generates a positive write voltage VWW such as +18V to be applied to the word line WL as a capacitive load in the memory array 10 which is a nonvolatile memory device, and the charge pump CP22 generates a negative erase voltage VEW such as −16V to be applied to the word line WL. In the capacitor parallel type charge pumps CP11 and CP12 in the first booster 1, the voltage VWDP boosted by the charge pump CP11 is supplied to the second booster 2 and the Y decoder & sense and latch circuit 11 for precharging a bit line BL in the memory array 10, and the voltage VCP boosted by the charge pump CP12 is supplied to an internal logic gate circuit 4, a word decoder 5, a voltage step-down circuit 6 constructed by a resistance dividing circuit or the like, for generating a read voltage to be applied to the word line WL, and the like. The voltage step-down circuit 6 generates a read voltage VR in a normal read mode, a verify voltage VVW in a write mode, and an erasure verify voltage VVE in an erasure mode.

The internal logic gate circuit 4 denotes, not a logic gate circuit constructing an address buffer, a data buffer, or the like operated on the external source voltage Vcc, but a logic gate circuit which operates on an internal boosted voltage such as a decoder provided relatively close to the memory array 10, a direct control circuit for determining an end of a writing/erasing operation, and a power switching circuit.

Further, the second booster 2 is provided with an amplitude doubling circuit 3 for doubling the amplitude of the clock CK1. The amplitude doubling circuit 3 is constructed to generate a clock PCLK1 having an amplitude of 2VWDP on the basis of the boosted voltage VWDP generated by the booster 1.

The clocks CK1, CLK1, and CLK2 are supplied from the clock generating circuit (of the block 34 in FIG. 1) in the chip. The supply of the clocks to the charge pumps CP11, PC12, CP21, and CP22 can be interrupted by gates 7a, 7b, 7c, and 7d controlled by start signals ST1, ST2, ST3, and ST4 from the control circuit (block 32 in FIG. 1). When the supply of a clock is interrupted, the corresponding charge pump stops the boosting operation.

In the embodiment of FIG. 7, reference numeral 8 denotes a word driver (block 14a in FIG. 1) for receiving a select signal from the word decoder 5 and driving a word line WL to a predetermined level according to the operation mode, 9a and 9b denote voltage switches for selecting a voltage according to the operation mode and supplying the selected voltage to the word driver 8, and 9c indicates a switch for selectively supplying the boosted voltage VWDP to the sense and latch circuit 11 or the second booster 2 in the writing operation. The control signal B for starting the application of the write voltage supplied from the control circuit 32 to the word driver 14a is used, for example, to control the voltage switch 9a.

As described above, in the embodiment, the booster 1 for performing the boost of the first stage is constructed by the two capacitor parallel type charge pumps CP11 and CP12. Consequently, the power consumption can be reduced by stopping the operation of one of the charge pumps in accordance with the operation mode. Even when the source voltage is low, the control of generating the boosted voltage of a desired level with reliability can be performed.

Specifically, in the flash memory of the embodiment, the charge pump CP12 for generating the boosted voltage VCP supplies the operation power to the internal logic gate circuit 4 and the voltage step-down circuit 6. Consequently, the charge pump CP12 operates in any of the operation modes, that is, all the time. Since a high boosted voltage is unnecessary in the read mode, the operation of the charge pump CP11 for generating the boosted voltage VWDP is stopped, thereby reducing the power consumption. When the operation of the charge pump CP11 for generating the boosted voltage VWDP is stopped, the operations of the charge pumps CP21 and CP22 in the booster 2 for performing the boost of the second stage on the basis of the boosted voltage VWDP are also stopped. The operations of the charge pumps CP12, CP21, and CP22 can be stopped by interrupting the operation clocks supplied to the charge pumps CP12, CP21, and CP22 by the start signals ST2 and ST3.

In the embodiment of FIG. 1, the charge pumps CP21 and CP22 in the booster 2 for performing the boost of the second stage generate the positive boosted voltage VWW used for the writing operation and the negative boosted voltage VWE used for the erasing operation, respectively. Therefore, by controlling to stop the operation of the charge pump CP22 in the write mode and to stop the operation of the charge pump CP21 in the erase mode, the power consumption can be reduced.

Further, in the embodiment, the charge pump CP11 for performing the boost of the first stage on the basis of the source voltage is constructed of the capacitor parallel type. Each of the charge pumps CP21 and CP22 for performing the boost of the second stage on the basis of the boosted voltage VWDP generated by the charge pump CP11 is constructed of the capacitor serial type. The charge pump of the capacitor serial type has a characteristic that, although charges are consumed by parasite capacity and a resultant voltage is rapidly saturated when the number of stages increases, voltages applied to capacitors for boosting at the stages disposed in series are almost equal to each other, and designing is easy from the viewpoint of a withstand voltage. On the other hand, the capacitor parallel type charge pump is not adapted to deal with a high boosted voltage from the viewpoint of a high withstand voltage since the voltages applied to the capacitors arranged in parallel are various and become higher in stages. However, the capacitor parallel type charge pump has a characteristic that even when the number of stages of capacitors is large to an extent, the boosted voltage is not easily saturated as compared with the charge pump of the capacitor serial type. Consequently, by using the charge pump of the capacitor parallel type as the charge pump for performing the boost of the first stage and using the capacitor serial type as the charge pump for performing the boost of the second stage as stated above, as compared with the case where the types are opposite, a relatively high boosted voltage can be generated more efficiently.

Figure 8:
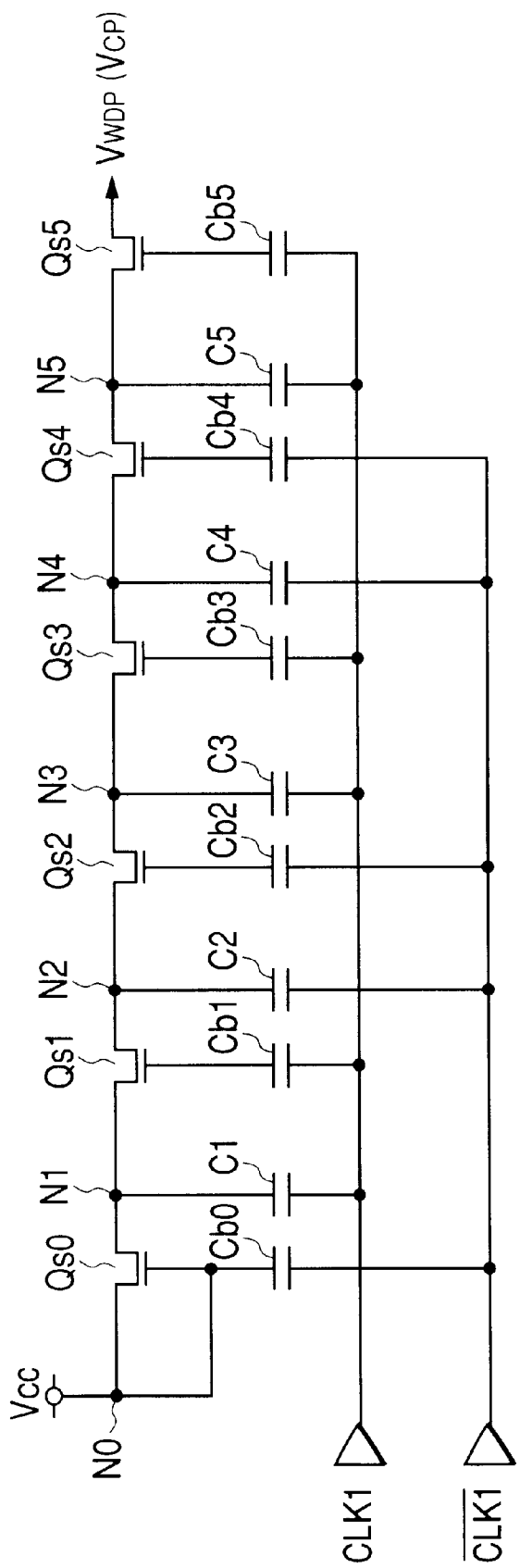
FIG. 8 is a circuit diagram showing an example of a capacitor parallel type charge pump for performing a boost of a first stage.

FIG. 8 shows a schematic configuration of each of the charge pumps CP11 and CP12 of the capacitor parallel type in the booster 1 for performing the boost of the first stage.

The charge pump of FIG. 8 has capacitors C1 to C5 for boosting a voltage in five levels, arranged in parallel, switch MOSFETs Qs1 to Qs4 provided between charge side terminals (nodes N1 to N5) of the capacitors, a switch MOSFET Qs0 capable of applying the external source voltage Vcc to the charge side terminal (node N1) of the capacitor C1 at the first stage, a switch MOSFET Qs5 for transmitting the voltage VWDP (VCP) of the charge side terminal (node N5) of the capacitor C5 at the final stage to a circuit for receiving the voltage supply, and capacitors Cb0 to Cb5 for instantaneously boosting a gate voltage to turn on the switch MOSFETs Qs0 to Qs5. The capacitance value of each of the capacitors Cb0 to Cb5 for instantaneous boost is set to be sufficiently smaller than that of each of the capacitors C1 to C5 for boost. Each of the switch MOSFETs Qs0 to Qs5 functions as a diode by being turned on by the boosted voltage.

To reference side terminals (terminals opposite to the charge side terminals) of the odd-numbered capacitors C1, C3, and C5 out of the capacitors C1 to C5 for boost, the clock CLK1 having an amplitude of 0V to Vcc is applied. To reference side terminals of the even-numbered capacitors C2 and C4, a clock /CLK1 of the phase opposite to that of the clock CLK1, similarly having an amplitude of 0V to Vcc, is applied. The reference side terminals of the odd-numbered capacitors C1, C3, and C5 and those of the even-numbered capacitors C2 and C4 are alternately boosted by the clocks CLK1 and /CLK1 of opposite phases, and the switch MOSFETs Qs0 to Qs5 are controlled to operate like diodes, thereby transferring the charges in the capacitor C1 to the capacitors C2, C3, C4, and C5 in this order to generate a boosted voltage. Although not limited, the clock CLK1 has the cycle of 50 nS or the like.

Figure 9:
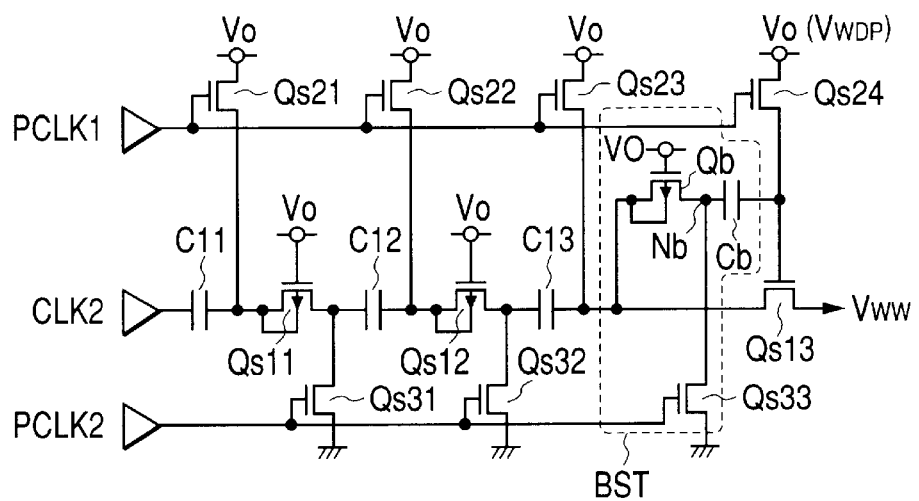
FIG. 9 is a circuit diagram showing an example of a capacitor serial type charge pump for generating a positive voltage, which performs a boost of a second stage.

FIG. 9 shows a schematic configuration of the charge pump CP21 for generating a positive boosted voltage in the capacitor serial type charge pumps CP21 and CP22 in the second booster 2.

The charge pump of FIG. 9 has capacitors C11 to C13 for performing a boost in three levels, connected in series via MOSFETs, switch MOSFETs Qs11 and Qs12 capable of connecting or interrupting the capacitors, a switch MOSFET Qs13 for transmitting the voltage VWW on the charge side terminal of the capacitor C13 at the final stage to a circuit for receiving the voltage supply, switch MOSFETs Qs21 to Qs23 each connected between the charge side terminal (high potential side terminal) of the capacitor and the source voltage terminal V0, switch MOSFETs Qs31 and Qs32 connected between the reference side terminals (low potential side terminals) of the capacitors C12 and C13 at the second and third stages and the ground potential Vss (0V), respectively, a switch MOSFET Qs24 connected between the gate terminal of the MOSFET Qs13 at the final stage and the source voltage terminal V0, and a booster BST for boosting the gate voltage to sufficiently turn on the switch MOSFET Qs13 at the final stage.

The booster BST is constructed by a MOSFET Qb and a capacitor Cb for instantaneous boost connected in series between the charge side terminal (high potential side terminal) of the capacitor C13 for boost and the gate terminal of the switch MOSFET Qs13 at the final stage, and a switch MOSFET Qs33 connected between a connection node Nb of Qb and Cb and the ground potential Vss (0V). Qs11 and Qs12 out of the switch MOSFETs Qs11 to Qs13 and the MOSFET Qb in the booster are of the p-channel type. By applying the voltage V0 to their gate terminals, they are turned off in normal times for the reason that the potentials of the source and drain of the MOSFETs Qs11 and Qs12 are always the same or the potential of the node on the ante stage side is higher than the other, and the potential at the node on the post stage side does not become higher. That is, by connecting the well areas of the MOSFETs Qs11, Qs12, and Qb to the nodes at the ante stage sides, a p-channel MOSFET having an n-type well can be used. By forming the MOSFETs Qs11 and Qs12 of the p-channel type, the potential boosted at the ante stage can be transmitted to the post stage without a potential drop (drop in Vth).

On the other hand, the switch MOSFET Qs13 of the n-channel type is used since the potential relation between the source and drain is not determined, and the booster BST is provided to transmit the voltage boosted at the ante stage to the post stage without a drop in potential (drop in Vth). Similarly, as the switch MOSFETs Qs21 to Qs24 for precharging the capacitors by applying the voltage V0 to both terminals of the capacitors C11 to C13 for boost, since the potential relation between the source and drain is not determined, MOSFETs of the N-channel type are used. When the charge voltage is set as V0, the potential may drop in an N-channel type MOSFET. Consequently, the clock PCLK1 having an amplitude of 2V0 as shown in FIG. 10 is applied to the gate terminals of the Qs21 to Qs24.

Figure 10:
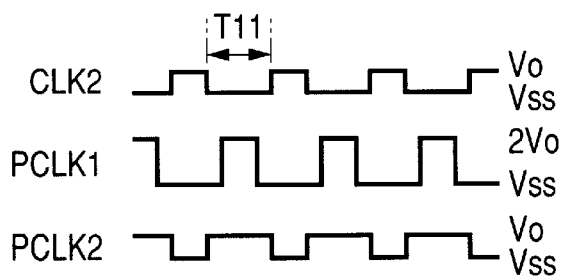
FIG. 10 is a timing chart showing timings of operation clocks of the charge pump of FIG. 9.

As the MOSFETs Qs31 to Qs33, MOSFETs of the N-channel type are used to supply the ground potential Vss to one of the terminals of each of the capacitors C12 and C13 for boost and the boost capacitor Cb, and a clock PCLK2 having an amplitude of V0 as shown in FIG. 10 is applied to the gate terminals of the MOSFETs. The phase of the clock PCLK1 is opposite to that of the clock CLK2 having the amplitude V0 to be applied to the reference side terminal of the capacitor C11 for boost at the first stage, and the clock PCLK2 has the same phase as that of PCLK1. Although not limited, each of the clocks CLK2, PCLK1, and PCLK2 has a cycle of 100 nS which is double of the cycle of the operation clock CLK1 of the capacitor parallel type charge pump CP11.

The charge pump of the embodiment uses, as the operation voltage V0, the boosted voltage VWDP generated by the capacitor parallel type charge pump CP11. In a period T11 in which the clock CLK2 to be applied to the reference side terminal of the capacitor C11 for boost at the first stage is at the low level, by changing the clocks PCLK1 and PCLK2 to the high level and turning on the switch MOSFETs Qs21 to Qs24, Qs31 and Qs32, the capacitors C11, C12, and C13 for boost are precharged to V0. After that, the switch MOSFETs Qs21 to Qs24, Qs31, and Qs32 are turned off, both terminals of each of the capacitors C11, C12, and C13 for boost are interrupted from the source voltage terminal and the ground terminal, and the clock CLK1 is changed to the high level. As the potential of the node on the ante stage side, that is, the source potential becomes higher than the gate potential (=V0), the switch MOSFETs Qs11 and Qs12 are automatically turned on, and the capacitors C11, C12, and C13 for boost are connected in series. As a result, a boosted voltage corresponding to an almost the total (=3V0) of the precharge voltages of the capacitors C11 to C13 for boost is generated.

At this time, in the booster BST, simultaneously with the precharging of the capacitors C11 and C13 for boost, the capacitor Cb for boost is precharged to V0. When the clock CLK1 is changed to the high level, like the switches MOSFETs Qs11 and Qs12, the MOSFET Qs13 is turned on, thereby boosting the gate voltage of the switch MOSFET Qs13 at the final stage to a potential higher than the potential (source potential) of the node at the ante stage side by an amount of the precharge voltage V0, so that the MOSFET Qs13 enters a sufficient ON state. Consequently, the boosted voltage generated by the capacitors C11 to C13 can be transmitted to a circuit at the post stage without a potential drop.

Since the basic configuration of the charge pump CP22 for generating the negative boosted voltage VEW out of the capacitor serial type charge pumps CP21 and CP22 in the second booster 2 is similar to that of FIG. 9 except that the polarity of a voltage generated is opposite to that of the CP 21, it is not shown.

The charge pump CP22 for negative voltage is different from the charge pump for positive voltage in FIG. 9 with respect to the following points. The conduction types of the MOSFETs used are opposite to each other, that is, N-MOS is used instead of P-MOS in FIG. 9, and P-MOS is used in place of N-MOS. The amplitude of the clock PCLK2 is different from that in FIG. 9. The direction of precharging of the capacitors C11 to C13 for boosting which are connected in series is opposite to that in FIG. 9. The timings of the clocks CLK2, PCLK1, and PCLK2 are different from each other. At the time of precharging, in the charge pump of FIG. 9, the ground potential Vss is applied in advance to the reference side terminal of the capacitor C11 for boost at the first stage and the voltage is increased to Vcc in the boosting operation. In contrast, in the charge pump for negative voltage, the source voltage V0 is applied in advance to the reference side terminal of the capacitor C11 for boost at the first stage, and the voltage is dropped to the ground potential Vss in the boosting operation, thereby generating the negative voltage.

The method of applying the write voltage to the word line in the writing mode and the configuration of the internal power generating circuit have been described above. In the flash memory of the embodiment, regarding the voltage to be applied to the bit line BL as well, the method of applying the boosted voltage is devised.

In the flash memory of the embodiment, in the writing mode, a high voltage is applied to the word line WL (control gate) and, by using the FN tunnel phenomenon, negative charges are injected to the floating gate of a memory cell to increase the threshold voltage of the memory cell. Consequently, according to write data, the bit line BL to which a memory cell desired to have the high threshold voltage (for example, data "1") is connected is not precharged, that is, is set to 0V. On the other hand, the bit line to which a memory cell whose threshold voltage is not desired to be increased (for example, data "0") is connected is precharged to 5.5V. In the writing mode, the source of each selection memory cell is floated (open). In the specification, the voltage to be applied to the bit line to which the memory cell whose threshold voltage is not desired to be increased is connected will be called a write check voltage.

Figure 11:
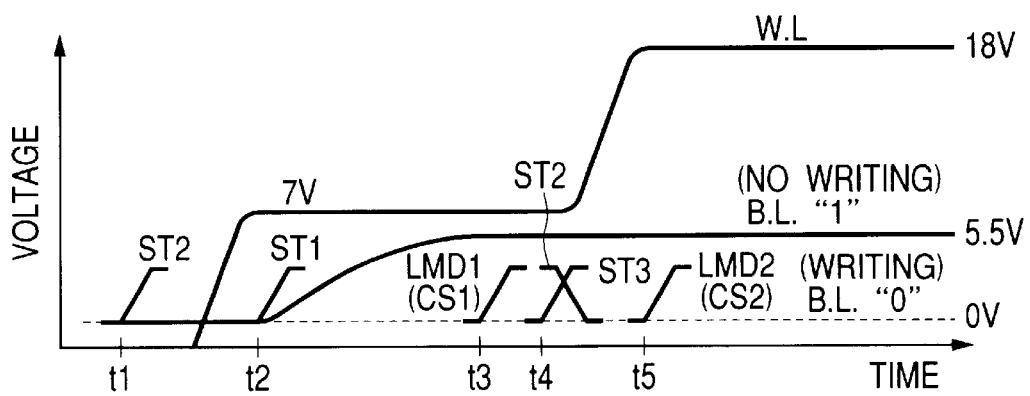
FIG. 11 is a timing chart showing an example of a start timing of a booster in a data writing operation on the flash memory to which the invention is applied.

As shown in FIG. 11, in the flash memory of the embodiment, in the writing mode, the voltage of the word line WL is boosted in two levels by being increased once to 7V and then to 18V by the control circuit 32. The voltage of the bit line BL is boosted to 5.5V in a period since the word line WL is raised to 7V until it is raised to 18V. The CPU 321 of the control circuit 32 performs such a control by outputting the start signals ST1, ST2, and ST3 at predetermined timings to the charge pumps CP11, CP12, and CP21 on the basis of detection signals LMD1 and LMD2 from the limiters LM1, LMT2, and LM3 of the charge pumps and an output of the timer.

Figure 12:
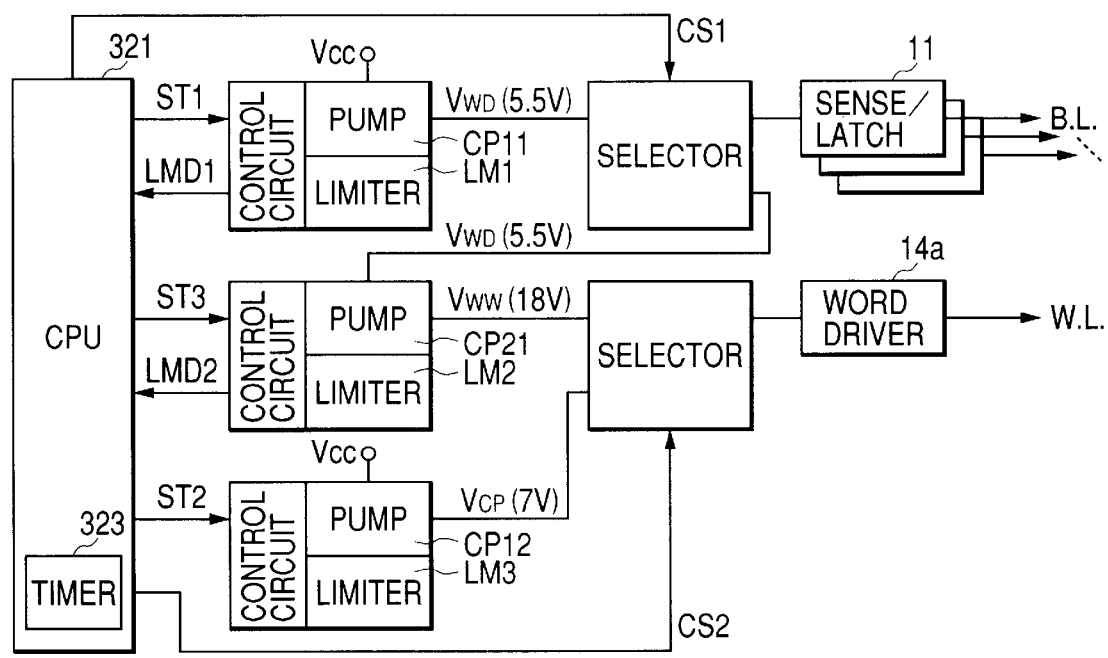
FIG. 12 is a block diagram showing the schematic configuration of a boosted voltage supply circuit in FIG. 7.

FIG. 12 schematically shows a boosted voltage supply circuit of FIG. 7. In FIG. 12, circuit blocks designated by the same reference numerals as those in FIG. 7 denote the same circuit blocks. It is assumed that the charge pumps CP11, CP12, and CP21 shown in FIG. 12 include the control gates 7a, 7b, and 7c in FIG. 7 (374 in FIG. 4) and the control gate 375 in FIG. 4. SEL1 denotes a selector for selectively supplying the boosted voltage VWD generated by the charge pump CP11 to either the sense and latch circuit 11 or the charge pump CP21 at the second stage, and SEL2 denotes a selector for selectively supplying the boosted voltage generated by the charge pump CP21 or CP12 to the word driver 14a. Each of the selectors SEL1 and SEL2 can be constructed by an analog switch, and switch control signals CS1 and CS2 are supplied from the CPU 321 in the control circuit 32.

When a write command is supplied, first, the CPU 321 changes the start signal ST2 to the charge pump CP12 to the high level to start the boosting operation (timing t1). After elapse of a predetermined time, the CPU 321 changes the start signal S12 to the charge pump CP11 to the high level to start the boosting operation (timing t2). Since all of the bit lines BL (each having a parasite capacity of a few pF) are subjects to be precharged, the load capacity is obtained by multiplying the load capacity by the number of bit lines (1 to 8×103). The number of word lines WL to be selected is one, and the load capacity is a few pF. Consequently, even when the source voltage Vcc is at a low level such as 1.8V, a desired boosted level (7V) can be achieved in a relatively short time. When it is regarded that the voltage is boosted on the basis of not the detection signal from the limiter LM3 but time, there is no harm.

In response to a change of the detection signal LMD1 from the limiter LM1 of the charge pump CP11 to the high level (timing t3), the CPU 321 switches the switch signal CS1 to the selector SELL to supply the boosted voltage VWD generated by the charge pump CP11 to the charge pump CP21, and changes the start signal ST3 to the charge pump CP21 to the high level to start the boosting operation (timing t4). At this time, the CPU 321 negates the start signal ST2 to the charge pump CP12. After that, when the boosted voltage VWW of the charge pump CP21 reaches a predetermined level (18V), the detection signal LMD2 from the limiter LM2 goes high (timing t5). The switch signal CS2 to the selector SEL2 is therefore switched to supply the boosted voltage VWW generated by the charge pump CP21 to the word driver 14a.

In the flash memory of the embodiment, the timer 323 is activated on start of the boosting operation of the charge pump CP21 in response to the start signal ST3 from the CPU 321. When the timer counts up the predetermined time before the detection signal LMD2 from the limiter circuit LM2 goes high, the CPU 321 switches the switch signal CS2 to the selector SEL2 to supply the boosted voltage VWW generated by the charge pump CP21 to the word driver 14a. When the boosted voltage VWW is supplied to the word driver 14a, the timer 323 starts counting a time of application of the write voltage. When the CPU 321 determines that the predetermined time has elapsed on the basis of the timer, the CPU 321 negates the start signals ST1 and ST3 to the charge pumps CP11 and CP21.

As described above, according to the embodiment, in the writing mode, the word line WL is raised in two levels. When the precharge of the bit line BL is finished, the charge pump CP21 at the second stage is started. The charge pump CP11 for generating the boosted voltage for precharging the bit line BL also serves as the charge pump at the first stage of the booster for word line. Consequently, at the second and subsequent writing operations performed before the threshold voltage reaches a target value in write verifying, the rise time (from t2 to t3 in FIG. 11) of the charge pump CP11 becomes shorter, so that the time required to boost the word line becomes shorter and the word line can be prevented from being started to be boosted before the bit line BL reaches a correct precharge level (5.5V).

As a result, a change in the threshold voltage of a not-selected memory cell, called a "disturb", can be prevented. Specifically, like in the embodiment, in the case of boosting the word line after elapse of the predetermined time even if the boosted voltage of the charge pump for raising the word line does not reach the target level, if no counter measure is taken, before the bit line BL reaches the correct precharge level (5.5V) but is, for example, at 4.5V, the word line is started to be boosted, and a disturb may occur. In the embodiment, however, after confirming that the boosted voltage for the bit line has reached the target level, the boosting operation of the charging pump at the second stage for boosting the word line is started by the boosted voltage of the charge pump which generates the voltage. Thus, it can be avoided that the boost of the word line is started before the bit line BL reaches the correct precharge level (5.5V).

As described above, in the flash memory to which the invention is applied, even if the source voltage Vcc is at a low level such as 1.8V and the boosted voltage of the charge pump does not reach the target level, the writing operation is started on the basis of time. Consequently, it can be prevented that the program cannot be escaped from the writing mode. Moreover, even when the potential of the word line is lower than the target level more or less, by increasing the time, that is, the number of writing times, data can be written to the memory device of the flash memory. Although there is a drawback that the writing time becomes longer a little, the memory device of the flash memory has an advantage that the correct writing can be performed.

Among portable electronic devices often operated on batteries, a storage medium for a recording/reproducing device for music is often used in such a manner that reproduction is performed by a reproducer driven on a battery and recording is executed by a device of which source voltage of 3.3V or higher is guaranteed. For example, in a portable electronic device driven on a battery of a low level such as 1.8V, even when data cannot be recorded, that is, written to the storage medium, there is little harm. On the other hand, it is expected that a voice recorder used for recording conversation in normal time or the like usually records voice by a device driven on a battery at a low level of 1.8V or the like. It is therefore inconvenient for the storage medium used for the voice recorder that if writing operation cannot be performed with the low source voltage. In the voice recorder, as compared with the recording/reproducing device for music, the data amount is small, so that the high speed is not so required. It can be therefore said that the flash memory to which the invention is applied is optimum as a storage medium used for the voice recorder. Moreover, according to the embodiment, a product (flash memory) which can be used for both a system operated by the source voltage Vcc of 3V and a system operated by the source voltage Vcc of 1.8V can be provided. A medium on which voice is recorded by the voice recorder can be also reproduced by a stay-at-home audio device.

Figure 13:
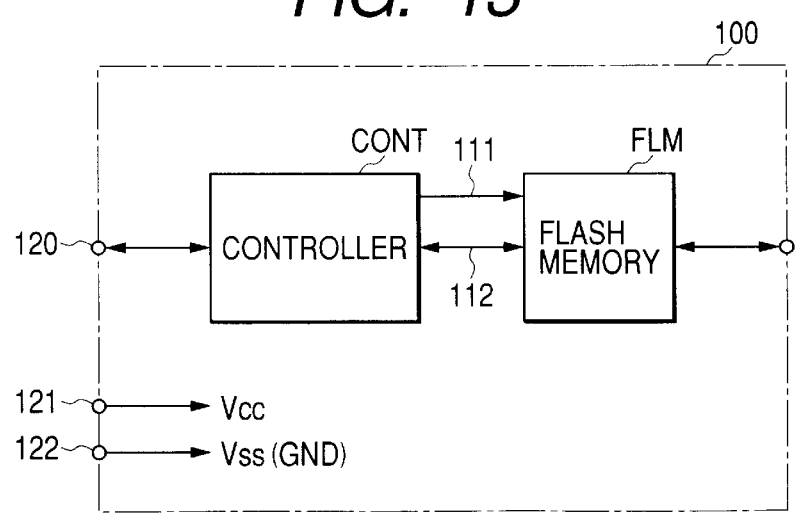
FIG. 13 is a block diagram showing an example of the internal configuration of a storage medium such as a memory card, SmartMedia, memory stick, or the like in the case where the flash memory of the embodiment is used as a storage medium for a voice recorder.

FIG. 13 shows an example of the internal configuration of a storage medium such as a memory card or a SmartMedia in the case where the flash memory of the embodiment is used as a storage medium for the voice recorder. The storage medium may be of an inner type that a connection terminal is not exposed to the outside. The storage media according to the invention include not only a storage medium of what is called a card type but also media of all types which can be loaded in an electronic device, such as a stick-shaped medium.

A storage medium 100 of the embodiment is constructed by, although not limited, housing a single flash memory chip FLM and a controller chip CONT having the functions of generating an address signal and a control signal to an interface with the outside and the flash memory, generating an ECC, and making a check in a package made of plastic or the like or mounting the flash memory chip FLM and the controller chip CON on a printed wiring board, and molding the whole by using a resin or the like.

The controller chip CONT is constructed by a dedicated LSI, a gate array, or the like and is connected to the flash memory chip FLM via a control signal line group (bus) 111 for sending control signals and an address and data signal line group (bus) 112 for transmitting the address signal, data signal, and a command code in a time division manner and also connected to a terminal 120 for external connection as an electrode inserted to come into contact with a card slot of an external portable electronic device or the like. An access to the flash memory chip FLM is made via the controller chip CONT. In place of the controller chip CONT, a general microcomputer may be used to generate a control signal or the like to be supplied to the memory chip FLM.

In FIG. 13, reference numeral 121 denotes an external power source terminal to which the source voltage Vcc to be supplied to the controller chip CONT and the flash memory chip FLM is applied, and 122 indicates an external ground terminal to which the ground potential is applied. Although the storage medium of the embodiment obtained by housing one controller chip CONT and one flash memory chip in the single package has been described as an example, a storage medium can be also constructed by only a single flash memory, or by a single controller chip CONT and a plurality of flash memory chips. In addition to the controller chip CONT, a CPU may be also housed. A storage medium may be also constructed by housing only a single chip microcomputer having therein a flash memory in a package.

Figure 14A:
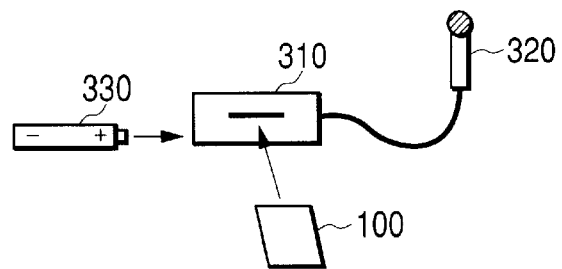
FIGS. 14A to 14C are block diagrams each showing the schematic configuration of a voice recorder as an example of an applied system using a card-type storage medium.
Figure 14B:
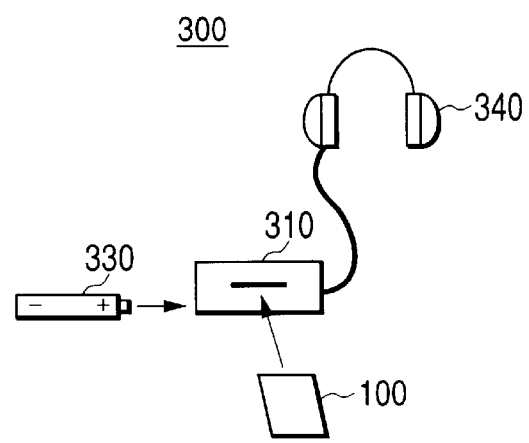
Figure 14C:
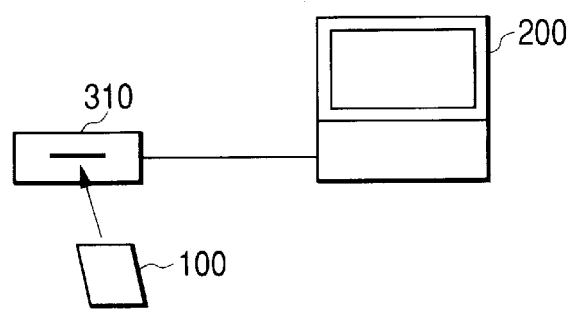

FIGS. 14A to 14C show a configuration according to a use state of a voice recorder as an example of an applied system using the card type storage medium. FIG. 14A shows a schematic configuration in the case of writing voice data to a storage medium. FIG. 14B shows a schematic configuration in the case of reproducing the voice data from the storage medium. FIG. 14C shows a schematic configuration in the case of editing or processing the voice data recorded in the storage medium. Shown in the FIGS. 14A to 14C are a voice recorder body 310, a microphone 320, a battery 330, a headphone or earphone 340, and a personal computer 350. In such a system, the storage medium 100 having therein the flash memory as shown in FIG. 13 is inserted to a medium insertion portion provided in the voice recorder body 310 and is used.

Figure 15:
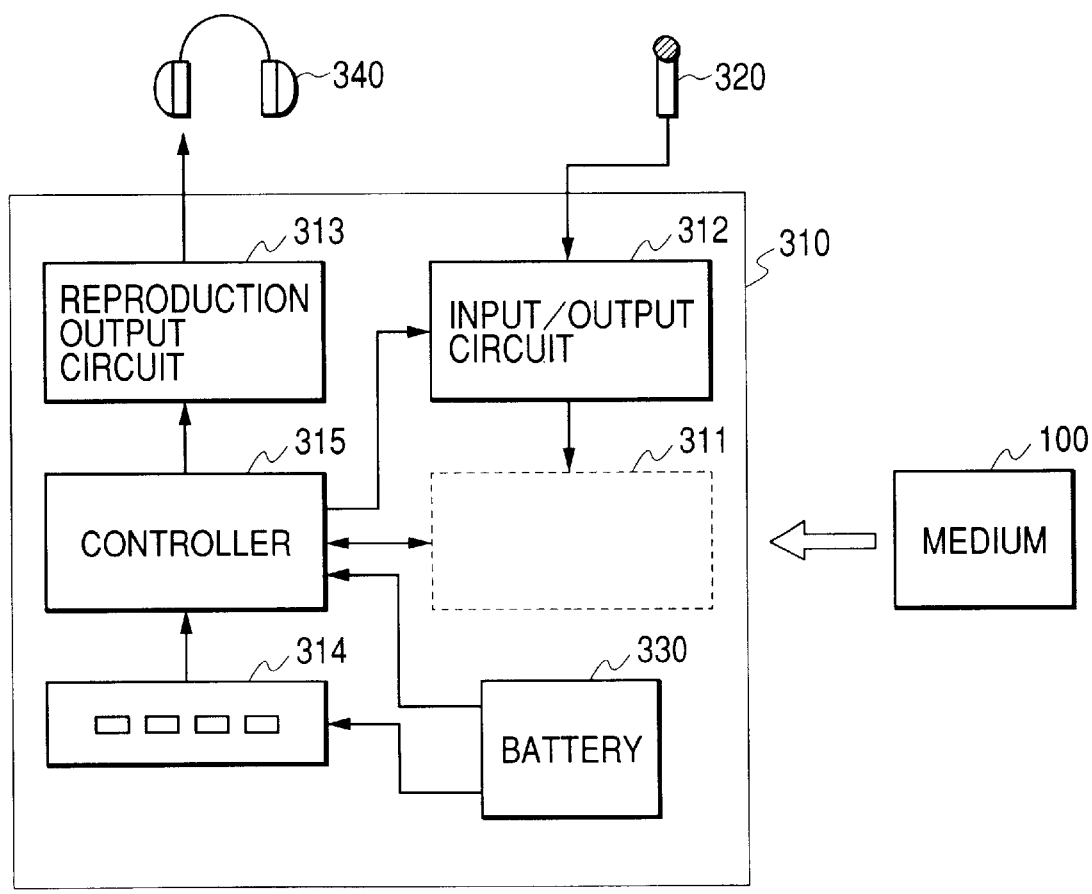
FIG. 15 is a block diagram showing the schematic configuration of an internal circuit of the voice recorder.

FIG. 15 shows a schematic configuration of an internal circuit of the voice recorder.

As shown in FIG. 15, the voice recorder body 310 includes a medium insertion portion 311 for removably holding the storage medium 100, an input and record circuit 312 for converting a sound electric signal input from the microphone 320 into a digital signal and writing the digital signal to the storage medium 100, a reproduction/output circuit 313 for reading the sound digital data from the storage medium 100, converting the sound digital data into an analog signal, and generating and outputting a signal for driving the headphone or earphone 340, input operation means 314 such as a touch panel used by the operator or user to give an instruction from the outside, and a controller 315 for controlling the recording circuit 312, the reproducing circuit 313, and the like in accordance with the instruction from the input operation means 314.

Another example of an applied system using a card type storage medium is an on-line music distributing system. The on-line music distributing system is a system for transmitting music data from a host computer to a terminal device via a telephone line and a communication network such as the Internet, storing the music data into a storage medium on the terminal device, inserting the storage medium into a portable device, reading the data, and reproducing the music. As the storage medium in the system, a medium having therein a flash memory as shown in FIG. 13 is used.

A music distributing system of, other than the method using communication, a method writing music data stored in a storage of a computer in a CD shop or the like into the storage medium is also proposed. In such a case, high-speedwriting is requested. It is therefore improper to write data by using a power source of the battery of 1.8V or the like to the storage medium having therein the flash memory according to the embodiment. In this case, however, since the data is written in a CD shop, it is sufficient to use a source voltage obtained by converting a commercial power source of AC 100V into a DC voltage such as 3.3V by an AC adapter or the like.

On the other hand, in the case of the music distributing system using communications, the communication speed is not so high at present. When a portable electronic device for recording/reproducing data to/from a storage medium is connected to a personal computer at home to write received music data into the storage medium, the recording can be performed by driving the portable electronic device on a battery source without using a source voltage of an AC adapter.

The invention achieved by the inventors has been specifically described above on the basis of the embodiment. Obviously, the invention is not limited to the embodiment but may be variously modified without departing from the gist. For example, the embodiment has been described that time data stored in the ROM is set in the timer and the timer starts the counting operation. The counting operation may be performed by using time data set in a register in place of the ROM.

Although the case where the invention achieved by the inventors is applied to the flash memory in the utilization field as the background has been described above, the invention is not limited to the case but can be widely used for a semiconductor memory requiring a plurality of boosted voltages and internally generating the boosted voltages. The invention is effective for application to a nonvolatile semiconductor memory for writing/erasing data to/from a nonvolatile memory element having a floating gate by using the FN tunnel phenomenon and is particularly effective for application to a multi-value memory for storing information of a plurality of bits in one element.

Effects obtained by a representative one of the inventions disclosed in the specification will be briefly described as follows.

According to the invention, the semiconductor memory capable of avoiding the situation that the program cannot be escaped from the writing operation and promptly finishing the writing operation in accordance with the level of an external source voltage is obtained. As a result, the throughput of the system using the semiconductor memory can be improved as a whole.

What is claimed is:

1. A semiconductor memory having a plurality of memory cells and a booster for generating a boosted voltage on the basis of a source voltage supplied from the outside, for applying said boosted voltage to a selected memory cell when the voltage generated by the booster reaches a predetermined level, comprising:
   a voltage detecting circuit for detecting whether said boosted voltage has reached a predetermined potential or not;
   a control circuit capable of controlling start and stop of a boosting operation of said booster; and
   a timer capable of counting predetermined time,
   wherein said control circuit applies said boosted voltage to a selected memory cell when said voltage detecting circuit detects that said boosted voltage has reached the predetermined potential and, when it is detected on the basis of counting information of said timer that the predetermined time has elapsed since said booster started the boosting operation, said control circuit applies the boosted voltage to said selected memory cell even if the boosted voltage generated by said booster has not reached the predetermined potential yet.

2. The semiconductor memory according to claim 1, further comprising switching means for supplying or interrupting said boosted voltage, wherein said switching means receives a control signal from said control circuit and applies said boosted voltage to said selected memory cell.

3. The semiconductor memory according to claim 2, further comprising a clock generating circuit for generating an internal clock signal.

4. The semiconductor memory according to claim 3, wherein said booster operates on the basis of a clock signal for boosting generated by said clock generating circuit, and said timer operates on the basis of a clock signal for counting generated by said clock generating circuit.

5. The semiconductor memory according to claim 4, further comprising a plurality of word lines, wherein each of said plurality of memory cells is connected to a corresponding word line, and said boosted voltage is applied to a word line to which the selected memory cell is coupled.

6. The semiconductor memory according to claim 5, wherein said booster has a positive voltage generating circuit for generating a positive high voltage on the basis of a source voltage from the outside and a negative voltage generating circuit for generating a negative high voltage on the basis of the source voltage from the outside.

7. The semiconductor memory according to claim 6, wherein each of said plurality of memory cells has a threshold voltage corresponding to data to be stored.

8. The semiconductor memory according to claim 7, wherein data is written/erased to/from each of said plurality of memory cells by using a tunnel phenomenon.

9. A semiconductor memory having a plurality of memory cells each having a threshold voltage corresponding to data to be stored, a plurality of bit lines, a plurality of data latches provided for the bit lines, and a booster for generating a boosted voltage on the basis of a source voltage supplied from the outside, each of said plurality of memory cells being coupled to a corresponding bit line, said boosted voltage being applied to said memory cell selected when said boosted voltage reaches a predetermined potential, and data being rewritten to the memory cell in accordance with data latched by said data latch, comprising:

a voltage detecting circuit for detecting whether said boosted voltage has reached a predetermined potential or not;

a control circuit capable of controlling start and stop of a boosting operation of said booster; and a timer capable of counting predetermined time, wherein said control circuit applies said boosted voltage to a selected memory cell when said voltage detecting circuit detects that said boosted voltage has reached the predetermined potential and, when it is detected on the basis of counting information of said timer that the predetermined time has elapsed since said booster started the boosting operation, said control circuit applies the boosted voltage to said selected memory cell even if the boosted voltage generated by said booster has not reached the predetermined potential yet.

10. The semiconductor memory according to claim 9, wherein each of said memory cells stores multi-value information by having any one of a plurality of threshold voltages.

11. The semiconductor memory according to claim 10, further comprising switching means for supplying or interrupting said boosted voltage, wherein said switching means receives a control signal from said control circuit and applies said boosted voltage to said selected memory cell.

12. The semiconductor memory according to claim 11, further comprising a clock generating circuit for generating an internal clock signal, wherein said booster operates on the basis of a clock signal for boost generated by said clock generating circuit, and said timer operates on the basis of a clock signal for counting generated by said clock generating circuit.

13. The semiconductor memory according to claim 12, further comprising a plurality of word lines, wherein each of said plurality of memory cells is connected to a corresponding word line, and said boosted voltage is applied to a word line to which the selected memory cell is coupled.

14. The semiconductor memory according to claim 13, wherein a second voltage boosted by said booster in accordance with data latched by said data latch and reached a predetermined potential is applied to said bit line, and said control circuit reserves activation of said timer until said second voltage reaches the predetermined potential.

* * * * *